US008634060B2

(12) United States Patent
Scharnweber

(10) Patent No.: US 8,634,060 B2
(45) Date of Patent: Jan. 21, 2014

(54) METHOD FOR A MULTIPLE EXPOSURE, MICROLITHOGRAPHY PROJECTION EXPOSURE INSTALLATION AND A PROJECTION SYSTEM

(75) Inventor: Ralf Scharnweber, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 534 days.

(21) Appl. No.: 12/725,223

(22) Filed: Mar. 16, 2010

(65) Prior Publication Data

US 2010/0173250 A1 Jul. 8, 2010

Related U.S. Application Data

(63) Continuation of application No. 12/142,138, filed on Jun. 19, 2008, now Pat. No. 7,875,418, which is a continuation of application No. 11/080,500, filed on Mar. 16, 2005, now Pat. No. 7,561,253.

(30) Foreign Application Priority Data

Mar. 16, 2004 (DE) .......................... 10 2004 013 886

(51) Int. Cl.
G03B 27/42 (2006.01)
(52) U.S. Cl.
USPC .................... 355/53; 355/55; 355/67; 355/77
(58) Field of Classification Search
USPC .......................................... 355/53, 55, 67, 77
See application file for complete search history.

(56) References Cited

U.S. PATENT DOCUMENTS

| 3,950,094 A | 4/1976 | Kano et al. |
| 4,054,386 A | 10/1977 | Suzuki |
| 4,367,046 A | 1/1983 | Lacombat |
| 4,634,232 A | 1/1987 | Tateoka |
| 4,734,746 A | 3/1988 | Ushida et al. |
| 5,473,410 A | 12/1995 | Nishi |
| 5,825,043 A | 10/1998 | Suwa |

(Continued)

FOREIGN PATENT DOCUMENTS

| DE | 3502339 | 8/1995 |
| DE | 10106861 | 2/2003 |

(Continued)

OTHER PUBLICATIONS

1020010068643 A.*

(Continued)

Primary Examiner — Steven H Whitesell Gordon
Assistant Examiner — Mesfin T Asfaw
(74) Attorney, Agent, or Firm — Fish & Richardson P.C.

(57) ABSTRACT

In a method for multiply exposing at least one substrate coated with a photosensitive layer, a first exposure is carried out in accordance with a first set of exposure parameters on a first projection system (17), and a second exposure is carried out in accordance with a second set of exposure parameters on a second projection system (18) spatially separated from the first projection system (17). The projection systems are integrated in a common projection exposure installation (1). The first exposure can be carried out, for example, with an amplitude mask (6), the second exposure with a phase mask (9). The use of a number of projection systems enables multiple exposure that is performed in parallel and is therefore time-saving.

24 Claims, 3 Drawing Sheets

(56) References Cited

U.S. PATENT DOCUMENTS

| | | | |
|---|---|---|---|
| 5,933,218 A | 8/1999 | Matsubara et al. | |
| 5,940,528 A | 8/1999 | Tanaka et al. | |
| 5,969,441 A | 10/1999 | Loopstra et al. | |
| 6,195,153 B1 | 2/2001 | Shimizu | |
| 6,341,007 B1 | 1/2002 | Nishi et al. | |
| 6,400,441 B1 | 6/2002 | Nishi et al. | |
| 6,406,834 B1 | 6/2002 | Kuit et al. | |
| 6,483,569 B2 | 11/2002 | Ota | |
| 6,549,269 B1 | 4/2003 | Nishi et al. | |
| 6,590,634 B1 | 7/2003 | Nishi et al. | |
| 6,600,550 B1 | 7/2003 | Shigematsu | |
| 6,611,316 B2 | 8/2003 | Sewell | |
| 6,710,848 B2 | 3/2004 | Taniguchi | |
| 6,721,034 B1 | 4/2004 | Horikawa | |
| 6,778,257 B2 | 8/2004 | Bleeker et al. | |
| 6,819,405 B2 | 11/2004 | Mulkens et al. | |
| 6,822,728 B2 | 11/2004 | McCullough et al. | |
| 6,870,601 B2 | 3/2005 | Liebregts et al. | |
| 6,897,455 B2 | 5/2005 | Lin | |
| 6,897,963 B1 | 5/2005 | Taniguchi et al. | |
| 6,952,253 B2 | 10/2005 | Lof et al. | |
| 6,995,833 B2 | 2/2006 | Kato et al. | |
| 7,023,610 B2 | 4/2006 | Ohtuski et al. | |
| 7,088,425 B2 | 8/2006 | Tanaka et al. | |
| 7,561,253 B2 | 7/2009 | Scharnweber | |
| 7,875,418 B2 | 1/2011 | Scharnweber | |
| 2002/0123012 A1 | 9/2002 | Sewell | |
| 2002/0180943 A1 | 12/2002 | Mulkens et al. | |
| 2003/0129508 A1 | 7/2003 | Lin | |
| 2003/0231663 A1 | 12/2003 | Ohtsuki et al. | |
| 2004/0041104 A1 | 3/2004 | Liebregts et al. | |
| 2004/0157143 A1 | 8/2004 | Taniguchi | |
| 2004/0165159 A1 | 8/2004 | Lof et al. | |
| 2004/0233405 A1 | 11/2004 | Kato et al. | |
| 2005/0122495 A1* | 6/2005 | Kaplan et al. | 355/52 |
| 2005/0248856 A1 | 11/2005 | Omura et al. | |
| 2005/0280791 A1 | 12/2005 | Nagasaka et al. | |
| 2006/0012766 A1* | 1/2006 | Klosner et al. | 355/67 |
| 2006/0055907 A1 | 3/2006 | Kato et al. | |
| 2006/0121364 A1 | 6/2006 | Omura | |
| 2006/0231206 A1 | 10/2006 | Nagasaka et al. | |
| 2007/0013890 A1 | 1/2007 | Loopstra et al. | |
| 2007/0153247 A1 | 7/2007 | Nagasaka | |
| 2007/0216884 A1 | 9/2007 | Nagasaka | |
| 2008/0085471 A1 | 4/2008 | Anderson et al. | |
| 2008/0316451 A1 | 12/2008 | Mann et al. | |

FOREIGN PATENT DOCUMENTS

| | | |
|---|---|---|
| EP | 1091252 | 4/2001 |
| EP | 1 420 298 | 5/2004 |
| JP | A 59-123230 | 7/1984 |
| JP | A 05-175102 | 7/1993 |
| JP | A 6-124873 | 5/1994 |
| JP | A 07-057986 | 3/1995 |
| JP | A 08-130179 | 5/1996 |
| JP | A 8-313842 | 11/1996 |
| JP | A 09-045603 | 2/1997 |
| JP | A 10-163099 | 6/1998 |
| JP | A 10-214783 | 8/1998 |
| JP | A 10-232497 | 9/1998 |
| JP | A 10-303114 | 11/1998 |
| JP | A 11-135400 | 5/1999 |
| JP | 2000-021742 | 1/2000 |
| JP | A 2000-505958 | 5/2000 |
| JP | A 2000-164504 | 6/2000 |
| JP | A 2000-284492 | 10/2000 |
| JP | A 2001-510577 | 7/2001 |
| JP | 2001-297976 | 10/2001 |
| JP | A 2001-291654 | 10/2001 |
| JP | A 2003-045797 | 2/2003 |
| JP | A 2004-519850 | 7/2004 |
| JP | A 2004-289126 | 10/2004 |
| JP | A 2004-304135 | 10/2004 |
| JP | A 2005-039211 | 2/2005 |
| WO | WO 99/23692 A1 | 5/1999 |
| WO | WO 99/28790 A1 | 6/1999 |
| WO | WO 99/36949 | 7/1999 |
| WO | WO 99/46835 | 9/1999 |
| WO | WO 99/49504 A1 | 9/1999 |
| WO | WO 02/069049 A1 | 9/2002 |
| WO | WO 2004/019128 A2 | 3/2004 |
| WO | WO 2004/044541 | 5/2004 |
| WO | WO 2004/055800 A1 | 7/2004 |
| WO | WO 2004/057590 A1 | 7/2004 |
| WO | WO 2004/086468 A1 | 10/2004 |
| WO | WO 2004/090634 A2 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |

OTHER PUBLICATIONS

German Office Action, with translation, for corresponding DE Appl No. 10 2004 013 886.9, dated Jun. 11, 2012.

A. Rosenbluth et al., "Optimum Mask and Source Patterns to Print a Given Shape," 2002 Society of Photo-Optical Instrumentation Engineers, J. Microlith., Microfab., Microsyst., vol. 1, No. 1, Apr. 2002, pp. 13-30.

F. Schellenberg, "Resolution Enhancement Technology: The Past, the Present and Extensions for the Future," Proceedings of SPIE vol. 5377, Optical Microlithography XVII, May 2004, pp. 1-20.

G. VanDenberghe et al., Performance Optimization of the Double Exposure Alternating PSM for (sub-) 100nm ICs, Proceedings of SPIE, 2002, vol. 4562, pp. 394-405.

M. Levenson et al., "Improving Resolution in Photolithography with a Phase-Shifting Mask," IEEE Transactions on Electron Devices, vol. 29, No. 12, Dec. 1982, pp. 1828-1836.

W. Arnold, "Extending 193nm Optical Lithography," Semiconductor International, Sep. 2006, pp. 46-50.

* cited by examiner

METHOD FOR A MULTIPLE EXPOSURE, MICROLITHOGRAPHY PROJECTION EXPOSURE INSTALLATION AND A PROJECTION SYSTEM

CROSS-REFERENCE TO RELATED APPLICATIONS

This application is a continuation of, and claims priority under 35 U.S.C. §120 to, U.S. Ser. No. 12/142,138, filed Jun. 19, 2008, now U.S. Pat. No. 7,875,418, which is a continuation of, and claims priority under 35 U.S.C. §120 to, U.S. Ser. No. 11/080,500, filed Mar. 16, 2005, now U.S. Pat. No. 7,561,253. U.S. Ser. No. 11/080,500 claims priority from German patent application 10 2004 013 886.9 filed on Mar. 16, 2004. The complete disclosure of each these applications is incorporated herein by reference.

BACKGROUND OF THE INVENTION

1. Field of the Invention

The invention relates to a method for multiple exposure at least of one substrate coated with a photosensitive layer, a microlithography projection exposure installation for multiple exposure at least of one substrate coated with a photosensitive layer, and a projection system having an illumination system and a projection objective.

2. Description of the Related Art

The efficiency of projection exposure installations for the microlithographic fabrication of semiconductor components and other finely patterned devices is substantially determined by the imaging properties of the projection objectives. Moreover, the image quality and the wafer throughput that can be achieved with the installation are influenced substantially by properties of the illumination system arranged upstream of the projection objective. Said system must be capable of preparing the light of a primary light source, for example a laser, with the highest possible efficiency, and in the process of producing as uniform as possible a distribution of intensity in an illumination field of the illumination system.

Depending on the nature and size of the patterns to be produced on the wafer, suitable exposure parameters can be set on the illumination system and/or the projection objective. For example, conventional illumination with different degrees of coherence and annular field illumination or polar illumination can be set on the illumination system in order to produce an off-axis, oblique illumination. The numerical aperture can be set on the projection objective.

Given a prescribed wavelength of the primary light source, the selection of suitable exposure parameters can serve, inter alia, for imaging structures that it would not be possible to image with satisfactory quality by using other exposure parameters because of their small structural sizes. However, a long exposure time is frequently associated with a selection of exposure parameters for which such fine structures can be resolved, and so the wafer throughput turns out to be low. Such fine structures frequently cannot be correctly resolved given a selection of exposure parameters for which a higher wafer throughput is achieved, although structures with larger structural sizes can be.

Since the structures to be produced on the wafer can frequently be subdivided into fine and coarse structures, it can be favorable to carry out a double exposure of the wafer for which a first set of exposure parameters is used for imaging the coarse structures, while a second set of exposure parameters different from the first one is used for imaging the fine structures. The exposure parameters of the first set can be selected, for example, such that only a short exposure time is required for imaging the coarse structures. The exposure parameters of the second set can be optimized such that only those structures are imaged that are so fine that they cannot be imaged with the first set of exposure parameters. Of course, multiple exposures with more than two exposures are also possible.

In a known type of double exposure, an exposure by means of an amplitude mask is carried out with a first set of exposure parameters. It is possible in this way to make use of oblique illumination such as, for example, annular, dipole or quadrupole illumination in order to increase the resolution. A second exposure with a second set of exposure parameters is carried out with the aid of a phase mask. A coherent illumination with a low degree of coherence σ is normally set thereby at the illumination system. Such a method is described, for example, in the article entitled "Improving Resolution in Photolithography with a Phase-Shifting Mask" by M. D. Levenson, N. S. Viswanathan, R. A. Simson in IEEE Trans. Electr. Dev., ED-29(12), pp. 1828-1836, 1982, and in the article entitled "Performance Optimization of the Double-Exposure" by G. N. Vandenberghe, F. Driessen, P. J. van Adrichem, K. G. Ronse, J. Li, L. Karlaklin in Proc. of the SPIE, Vol. 4562, pp. 394-405, 2002. In the method for multiple exposure that is described there, a first set of exposure parameters is initially set on the projection system for the first exposure. Thereafter, a second set of exposure parameters is set on the projection system for the second exposure, and this requires a reconfiguration of the projection system. This reconfiguration of the projection system from the first to the second set of exposure parameters results in a time loss and in mechanical wear of the parts whose position and/or shape need to be varied in the reconfiguration.

SUMMARY OF THE INVENTION

It is an object of the invention to provide a method for multiple exposure that permits a high wafer throughput. It is another object to provide for the purpose of carrying out such a method a microlithography projection exposure installation with which it is possible by comparison with conventional systems to raise the productivity in conjunction with an at least unchanged quality and lower costs. It is yet another object to provide cost effective projection systems that can be used for such a method.

To address these and other objects the invention, according to one formulation of the invention, provides a method for multiply exposing at least one substrate coated with a photosensitive layer, comprising:

carrying out a first exposure of the substrate in accordance with a first set of first exposure parameters;

carrying out at least one second exposure of the substrate in accordance with a second set of second exposure parameters;

employing for the first exposure a first projection system, and for the second exposure a second projection system spatially separated from the first projection system.

According to another formulation, the invention provides a microlithography projection exposure installation for multiply exposing at least one substrate coated with a photosensitive layer, comprising:

a first projection system on which a first set of exposure parameters is set, and at least one second projection system, which is spatially separated from the first projection system, and on which a second set of exposure parameters is set.

Advantageous developments are specified in the dependent claims. The wording of all the claims is incorporated in the description by reference.

The method comprises the following steps: carrying out a first exposure of the substrate in accordance with a first set of first exposure parameters; and carrying out at least one second exposure of the substrate in accordance with a second set of second exposure parameters, use being made for the first exposure of a first projection system, and for the second exposure of a second projection system spatially separated from the first projection system. The sets of exposure parameters for the respective exposure can be set in an optimized fashion on the first and second spatially separated projection systems. It follows that there is no need to adjust the projection systems during the multiple exposure, and so time can be saved, on the one hand, and on the other hand no wear on movable parts of the projection system can occur owing to the changeover of the exposure parameters. The sequence of first and second exposure can be adapted to the requirements of the process. The first and the second projection system can advantageously be arranged in a common microlithography projection exposure installation in order to carry out the method in a simplified way.

In a development of the method, the first exposure is carried out with the aid of a first mask, and the second exposure is carried out with the aid of a second mask different from the first mask. When use is made of different masks for two exposures, it is possible, for example, for structures with a first structural direction to be imaged onto the substrate with the aid of the first mask, and for structures with a second structural direction different from the first to be so imaged with the aid of the second mask.

In a development of the method, the first mask is an amplitude mask and the second mask is a phase mask. Coarse structures can be imaged with the amplitude mask, which can be designed as a transmission mask or a reflection mask. Fine structures can be transferred onto the substrate with the phase mask, which can likewise be operated by transmission or reflection.

In an embodiment of the method, the first set of exposure parameters includes at least one exposure parameter which is not set or cannot be set in the case of the second projection system, and/or wherein the second set of exposure parameters includes at least one exposure parameter which is not set or cannot be set in the case of the first projection system. By setting different exposure parameters on the two projection systems, the latter can be optimized for different types of exposure. The complexity of each individual projection system used for the exposure can be reduced thereby. Such a reduction in the complexity of projection systems can contribute to reducing costs.

In a development of the method, a set of exposure parameters has at least one exposure parameter from the following group: Degree of coherence $\sigma$ of the illumination, annularity of the illumination, polarity of the illumination, orientation of the illumination with reference to at least one structural direction of the mask, time profile of the exposure, and wavelength of the exposure.

The degree of coherence $\sigma$ of illumination is denoted as the ratio of the output-side numerical aperture of the illumination system to the input-side numerical aperture of a downstream projection objective. In this case, small values of $\sigma$ correspond to a largely or completely coherent illumination, while the coherence decreases the larger $\sigma$ becomes. Annularity is understood as the radial intensity distribution of the illuminating light in a pupil plane. A distinction is made here between different forms of illumination, depending on whether a fraction of the light intensity lies in the vicinity of the optical axis (axial illumination), or whether a major part is located further removed therefrom (off-axis illumination). Polarity of the illumination is understood as the radial symmetry of an off-axis illumination. This can be a dipole symmetry or a quadrupole symmetry, for example. Such a multipolar illumination can have a specific orientation with reference to at least one structural direction of the mask. This orientation can be selected so as to achieve an improvement in the imaging quality.

The time profile of the exposure is understood not only as the exposure time period, but also the time variation in the radiation intensity during the exposure time period. The wavelength of the illuminating light can differ from exposure to exposure and/or between the projection systems, it thereby being possible to achieve an adaptation to the structures to be imaged.

In a development of the method, the position of the substrate is set in the case of the second exposure in the second projection system such that it can be set with an equivalent position of the substrate during the first exposure in the first projection system with an accuracy which is low compared with the smallest structural size to be projected. This enables an effective control of the overlay between structures that are imaged in the first exposure and the second one. Such a control has an advantageous effect on the quality of the structures that can be produced on the substrate with the aid of the method. The accuracy with which the overlay control should be carried out for the case of applying a microlithography projection exposure installation is in the region of a few nanometers. In order to achieve this accuracy, the substrate can be positioned in the projection system by means of a positioning device aided by measurement.

In an embodiment of the method, a transfer of the substrate from the first projection system to the second projection system is carried out between the first exposure and the second exposure. The two projection systems need not be moved by the transfer of the substrate. A suitable transport device can be provided in a microlithography projection exposure installation for the transfer of the substrate. Alternatively, of course, the substrate can also remain at the same location in the first exposure and in the second one if the projection objectives are moved relative to the substrate.

In a development of the method, during the transfer the substrate is intermediately stored after removal from the first projection system and before introduction into the second projection system. An intermediate storage device can be provided for this purpose. The intermediate storage enables the carrying out of first exposures to be continued even when the second exposure cannot be carried out directly subsequent to the first exposure. This can prove to be advantageous particularly when the second exposure requires a longer duration than the first exposure, or when it is necessary to carry out maintenance work, cleaning work etc. on the second projection system.

In a development of the method, for an exposure on a projection system, inputting the substrate into the area of an exposure position, positioning it in the exposure position with the aid of measurement, exposing it and outputting the substrate from the exposure position are carried out in this sequence, positioning a first substrate in the first projection system with the aid of measurement, and exposing a second substrate in the second projection system being carried out simultaneously at least temporarily. The wafer throughput that can be achieved with the method according to the invention can be substantially raised by such parallel working on two substrates simultaneously. Moreover, the loading of the light source can be substantially increased.

In a development of the method, a first polar illumination is set as exposure parameter for a first exposure, and a second polar illumination having an orientation different from the first exposure is set as exposure parameter for at least one second exposure. Particularly in the case of the use of dipole illumination, it is possible thereby for structures with different orientations to be transferred onto the substrate in an especially advantageous way.

In an embodiment of the method, the first exposure and the second exposure are performed with the light of the same assigned light source. It is possible to save costs by using two or more projection systems with a common light source for carrying out the method. An adjustable optical deflector for optionally deflecting light to the first projection system or to the second one can be provided as distribution device in a microlithography projection exposure installation. Such a deflector can be driven quickly, and so the light is available at the projection system at the desired instant. The deflector can have at least one rotatable and/or displaceable mirror, or an appropriate deflecting prism. The light loss during the deflection can be kept slight by using such a mirror or prism. As an alternative to a first and second exposure carried out in a temporary separate fashion with one light source, the first and the second exposure can also partly overlap temporarily when the light from the light source is split into two or more component beams by means of a distribution device. It is possible, as an alternative, for the microlithography projection exposure installation to be assigned a number of light sources.

An inventive microlithography projection exposure installation of the type mentioned at the beginning comprises a first projection system, on which a first set of exposure parameters is set or can be set, and comprising at least one second projection system which is spatially separated from the first projection system and on which a second set of exposure parameters is set or can be set.

In a development of the microlithography projection exposure installation, the wavelength at least of one assigned light source is shorter than 260 nm and is, in particular, 248 nm, 193 nm or 157 nm. The use of such short wavelengths permits the imaging of particularly fine structures. It is possible to use a number of light sources of different wavelengths in a microlithography projection exposure installation.

In an embodiment of the microlithography projection exposure installation, the latter has a first and/or a second projection system on which solely a specialized set of exposure parameters can be set or is set. Such a projection system can be adapted to the individual requirements of an exposure process. It is therefore not necessary that the projection system can be optimized for all conceivable conditions of use. This specialization eliminates a costly equipping of the projection system with movable and/or displaceable and/or exchangeable optical components for implementing diverse sets of exposure parameters. The operating costs can be optimized by the use of tailored "slim" projection systems that are optimized for specific types of exposure. It is possible to eliminate extensive special equipment that is available for providing greater variability in the case of conventional systems. With systems according to the invention, work sharing/task specialization is possible in accordance with the principle of assembly line operation.

In a development of the microlithography projection exposure installation, the first and/or the second projection system has an illumination system at which solely axial illumination with different degrees of coherence can be set. With such specialization of the illumination system, it is possible to eliminate optical components for producing off-axis illumination, for example on axicons.

In an embodiment of the microlithography projection exposure installation, the first and/or the second projection system has an illumination system at which solely coherent, conventional illumination with a degree of coherence σ of lower than 0.35 can be set. Such a projection system can be used advantageously in an exposure by means of a phase mask, since this should be carried out with beams that are incident on the mask substantially parallel to the optical axis.

In an embodiment of the microlithography projection exposure installation, the first and/or the second projection system has an illumination system at which solely off-axis illumination can be set. Such a projection system can be used, for example to produce solely a dipole illumination. Fine structures can be produced on the substrate even in the case of relatively long wavelengths of the illuminating light by double exposure on two projection systems in which the dipole illumination of the first and second projection system are differently oriented.

In a development of the microlithography projection exposure installation, the first and/or the second projection system has an illumination system which does not comprise an adjustable optical element. Such an illumination system can be optimally tailored to a specific exposure process. The renunciation of adjustable optical elements can effect a reduction in cost. Again, no mechanical wear of the components of the illumination system can occur.

In an embodiment of the microlithography projection exposure installation, the first and/or the second projection system has an illumination system which does not comprise an exchangeable optical element. The renunciation of exchangeable optical elements can favorably affect the imaging quality, since such an exchange is frequently associated with the introduction of contamination into the illumination system.

The invention also comprises a projection system of the type mentioned at the beginning in the case of which solely a coherent, conventional illumination with a degree of coherence σ of lower than 0.35 can be set, and a projection system according to the invention on which solely off-axis illumination can be set. Such a projection system can be integrated together with at least a second one in a microlithography projection exposure installation, but it can also be used alone in such an installation. As regards advantageous developments of such cost effective, specialized projection systems, reference may be made to statements above in the context of a microlithography projection exposure installation according to the invention.

Apart from emerging from the claims, the present and further features also emerge from the description and the drawings, it being possible for the individual features to be respectively implemented on their own or severally in the form of subcombinations in embodiments of the invention and in other fields, and advantageously being able to constitute embodiments which can be protected per se.

DETAILED DESCRIPTION OF THE PREFERRED EMBODIMENTS

Figure 1:
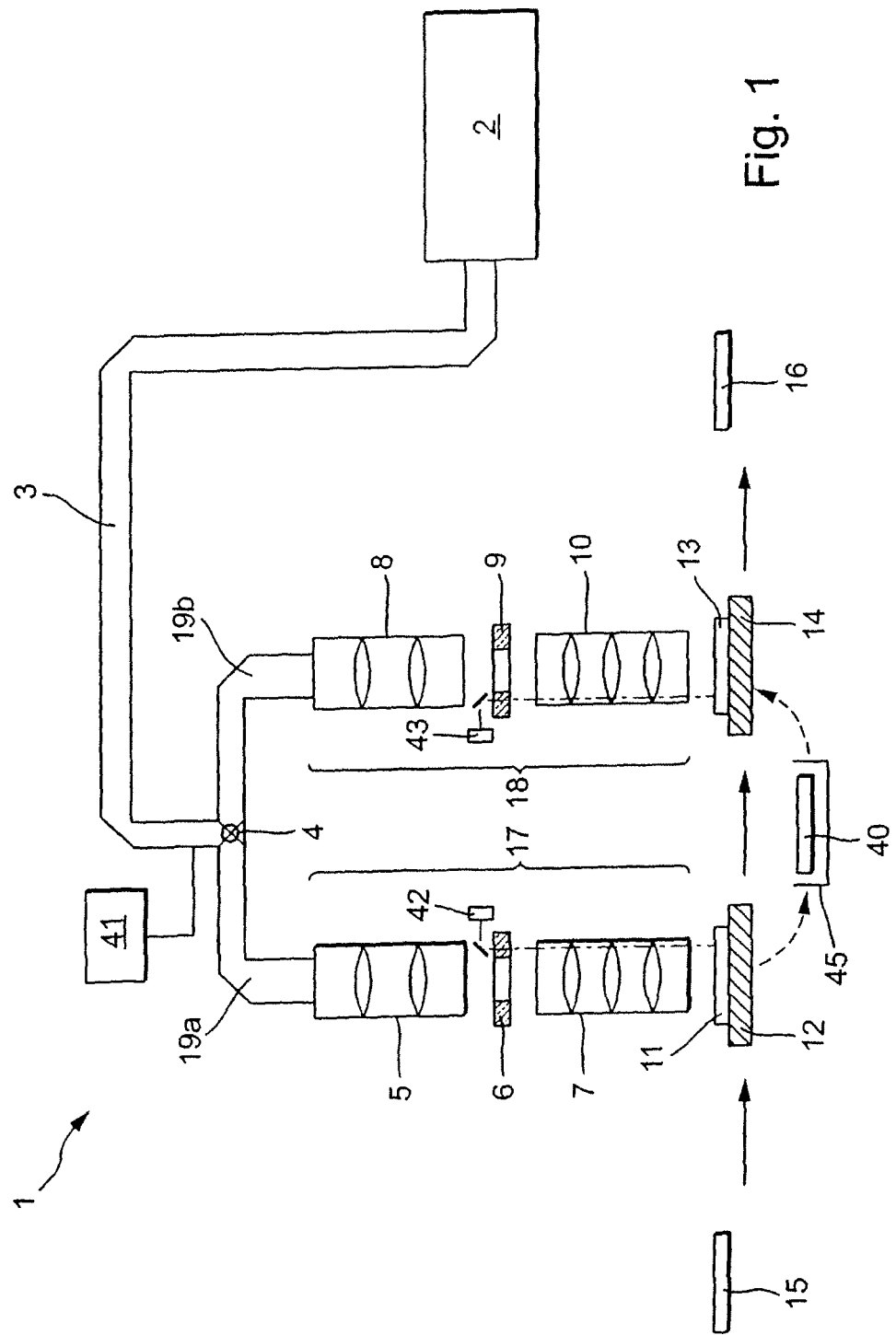
FIG. 1 shows a schematic overview of an embodiment of a microlithography projection exposure installation according to the invention.

FIG. 1 shows an example of a microlithography projection exposure installation 1 that can be used in the fabrication of semiconductor components and other finely structured subassemblies, and that operates to achieve resolutions of up to fractions of micrometers with light from the deep ultraviolet region. A KrF excimer laser with an operating wavelength of approximately 248 nm serves as light source 2. $F_2$ lasers with approximately 157 nm, ArF excimer lasers with a 193 nm operating wavelength, or mercury-vapor lamps with a 368 nm or 436 nm operating wavelength are also possible alternatively as UV light sources.

The laser 2 is connected to a device that prescribes the light path 3 up to an optical deflector 4. The light path 3 is divided there into two partial paths. Arranged in the first partial path 19a is a first projection system 17 that has a first illumination system 5 for illuminating a first mask 6, and a first projection objective 7 for imaging the structure supported by the first mask 6 onto a substrate to be exposed. Arranged in the second partial path 19b is a second projection system 18, which has a second illumination system 8 for illuminating a second mask 9, and a second projection objective 10 for imaging the structure supported by the second mask 9 onto a substrate to be exposed.

Each of the two projection systems 17, 18 further has a measurement-aided positioning system for setting the position of a wafer stage 12, 14, fitted below the respective projection system, relative to the position of the respective mask 8, 9 on the basis of optically detected measured data. The projection exposure installation 1 also has a control computer 41 for controlling the entire process taking place in the projection exposure installation.

A number of marked positions are provided for the wafer in the projection exposure installation 1. These positions are assumed successively by the wafer when a process such as exposure, measurement or storing is carried out thereon. An input position 15 serves for bearing the wafer before introducing it into the projection exposure installation 1. An exposure position 11 or 13 is assumed by the wafer during exposure on the first or second projection system, respectively. The wafer can be moved between the two exposure positions with the aid of a transport device and be held in the process, if appropriate, by means of an intermediate storage device 45 in a transfer position 40. The wafer finally assumes an output position 16 after being removed from the projection exposure installation 1.

While a double exposure is being carried out with the aid of the microlithography projection exposure installation 1, a wafer coated with photoresist and which constitutes a substrate that has a photosensitive layer and is to be exposed is transferred from the input position 15 into the vicinity of the first exposure position 11. Transport devices (not illustrated pictorial in the figure) are provided in the projection exposure installation 1 for this transfer and the following ones. In order to position the wafer exactly in the exposure position, the former is moved by means of the measurement-aided positioning device by means of a first wafer stage 12 until it has assumed the desired position relative to the first projection system 17 to the accuracy of a few nanometers. This positioning is carried out on the basis of measured data for an alignment system 42. The mask 6 is held by a holding device which can be moved such that the positioning of the mask can be coordinated with the positioning of the wafer. The wafer is exposed with the light that comes from the laser 2 and is directed at the optical deflector 4 into the first partial path 19a.

Figure 2:
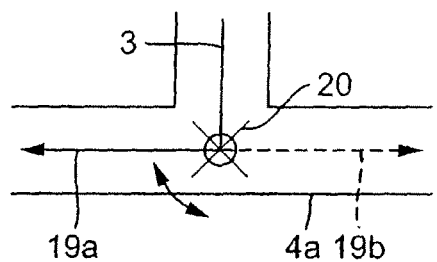
FIG. 2 shows a schematic plan view of a further embodiment of an optical deflector.

The adjustable optical deflector 4 can be designed in this case in an embodiment 4a as shown in plan view in FIG. 2. This has a rotatable mirror 20 for beam deflection. In the first position of the mirror 20 shown here, the illuminating light, which traverses the light path 3, is fully redirected in the first partial path 19a by having its direction deflected by 90° by the mirror. Alternatively, the mirror 20 can be rotated into a second position that permits the illuminating light to be deflected into the second partial path 19b. This second position of the mirror 20 is indicated by a dotted line in the figure. The mirror 20 can be driven automatically by means of the control computer 41 such that the path of the illuminating light can be switched over quickly between the first partial path 19a and the second partial path 19b. Automatic measurement of position and angle for the illuminating beam is provided for the purpose of introducing the light precisely into the two partial paths 19a, 19b.

Figure 3:
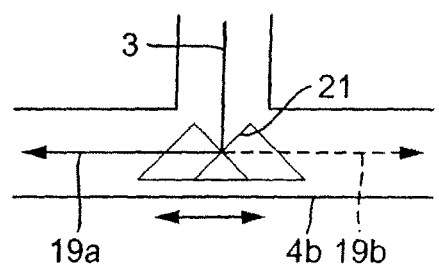
FIG. 3 shows a schematic plan view of a further embodiment of an optical deflector.

The adjustable optical deflector 4 can also be implemented in another embodiment 4b, as shown in plan view in FIG. 3. This has a displaceable reflecting prism 21 for beam deflection. The reflecting prism 21 is designed as an isosceles prism whose sides of equal length are each provided with a reflecting layer. The illuminating light, which traverses the light path 3, is redirected in the first position, shown in the figure, of the mirror 21 in the first partial path 19a by having its direction deflected by 90° by the reflecting layer. Alternatively, the mirror 21 can be displaced into a second position, which permits the illuminating light to be deflected into the second partial path 19b. This position of the reflecting prism 21 is illustrated by a dotted line in the figure.

As an alternative to the selective beam deflection with an adjustable optical deflector, the light can be irradiated into both partial paths 19a, 19b simultaneously with a suitable optical arrangement. This can be done, for example, by introducing a beam splitter instead of the mirror 20, or the reflecting prism 21. As an alternative, it is also possible to provide in the projection exposure installation a number of light sources which are of different wavelength, if appropriate, and whose light is directed to the projection systems with suitable distribution devices and split onto the projection systems.

Upon passage of the light coming from the deflector 4 through the projection system 17, a structure present on the first mask 6 is transferred onto the wafer. In the example illustrated here, the first mask 6 is an amplitude mask designed as transmission mask and in the case of which structures are applied in chromium on a quartz carrier. The exposure with the first mask 6 makes only moderate demands on the first projection system 17. The numerical aperture of the projection objective can be relatively small, since the structures to be imaged are very coarse. Despite the decidedly modest demands, it can be indicated to use optical improvements in the resolution in conjunction with a high numerical aperture for the purpose of exposure. In particular, it is possible thereby to make use of obliquely incident illumination, that is to say dipole illumination, quadrupole illumination or annular illumination, for example. The illumination system 5 is specialized for the abovenamed exposure parameters. It includes adjustable axicon elements for optionally setting off-axis light intensity, as well as a zoom system for setting the maximum degree of coherence. However, it is not possible to set an illumination with a low degree of coherence σ<0.35.

After the first exposure, the wafer is brought into the second exposure position 13. It is possible for the wafer to be intermediately stored during transport from the first exposure position 12 to the second exposure position 13. An intermediate storage device 45 is provided for this purpose in the projection exposure installation 1. In order to position the wafer in the second exposure position 13, the latter is moved by means of a measurement-aided positioning device by means of a second wafer stage 14 until it has assumed its desired position relative to the second projection system 18. In order to ensure exact superimposition of the successively produced exposure structures, the positioning is carried out with the aid of the measurement-aided positioning system with high accuracy with reference to proximity position (transverse and parallel to the optical axis), rotary position and tilted position. The wafer is subsequently exposed with the light coming from the laser 2, which is directed into the second partial path 19b with the aid of the optical deflector. A structure produced by the second mask 9 is transferred onto the wafer during the exposure.

In the second exposure, the mask 9 is a transmission phase mask that is suitable for imaging fine structures, for example the gate structures of transistors. The light striking the phase mask 9 is intended to strike the mask 9 in as parallel a way as possible, for which reason the illumination system is optimized for a coherent, conventional illumination with low degrees of coherence $\sigma$<0.35, and the projection objective 10 has a high numerical aperture. The projection system 18 is therefore specialized for exposure with a phase mask 9. It is therefore impossible to set off-axis illumination, for example, on said system. The illumination system therefore has neither adjustable axicon elements nor a changing device for optical components.

After the second exposure, the wafer is transferred from the second exposure position 13 into an output position 16, the double exposure of the wafer thereby being terminated. The structures produced on the photosensitive layer of the substrate are subsequently processed in a process step not illustrated pictorially for the purpose of patterning the substrate. If appropriate, the wafer is provided thereafter with a new photosensitive layer such that a further exposure process, for example another process of double exposure, can be undertaken until all structures required for producing a semiconductor component are produced on the wafer.

As an alternative to the case illustrated here by way of example, the first exposure and the second exposure can also be carried out with a first and a second amplitude mask different from the first. If the mask has, for example, fine structures running in two different structural directions, it is thus possible to set a dipole illumination optimized for the first structural direction in the first illumination system, and a second dipole illumination rotated with respect thereto in the second illumination system.

The embodiment, illustrated by way of example in FIG. 1, of a microlithography projection exposure installation according to the invention can be extended for multiple exposure by providing more than two projection systems. An integral flushing concept for avoiding contamination in the installation can be present for smooth running of the exposure. This can be implemented, for example, by nesting a number of separate flushing systems in one another such that the gas present in the installation becomes progressively cleaner from the outside inwards. The projection systems 17, 18 can be provided with adjustable correction elements and with measuring apparatuses that permit each individual projection system to be coordinated optimally with the production of a specific structure on the substrate.

The path of an individual wafer through the projection exposure installation 1 has been described with the aid of FIG. 1. Of course, more than only a single wafer can traverse the projection exposure installation 1 at any given instant, in order to raise the wafer throughput.

Figure 4:
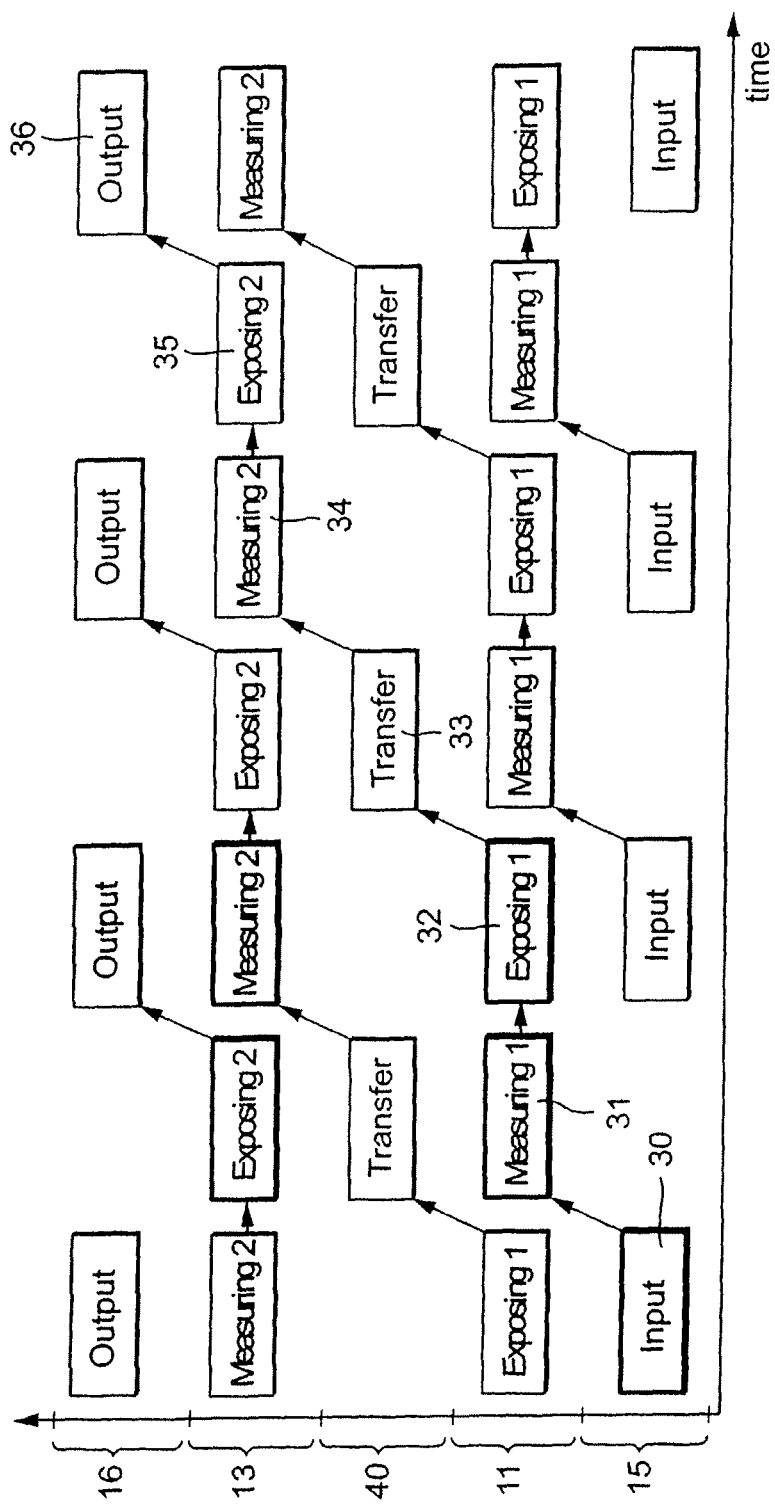
FIG. 4 shows a schematic for explaining a development of a method according to the invention for multiple exposure.

FIG. 4 shows a schematic for explaining a development of a method according to the invention. The ordinate is divided into five sections which respectively correspond to a position of a wafer in the microlithography projection exposure installation 1. The first position is the input position 15 of FIG. 1, the second position the exposure position 11 of the first projection system. The transfer position 40 is assigned to the third section. The second exposure position 13 of FIG. 1 is assigned to the fourth section, and the output position 16 to the fifth section. If a method step is carried out at one of the five positions of the projection exposure installation 1, this is illustrated in FIG. 4 by a box in which the measure carried out at the position is described. For the input position 15, the output position 16 and the transfer position 40, these activities are the input, output and transfer of a substrate. In the case of the first and second exposure positions 11, 13, this activity can comprise either a calibration operation (measurement-aided positioning) or an exposure operation. The temporal variation in the activities carried out at the individual positions is plotted along the abscissa.

If the path of an individual substrate is tracked in the projection exposure installation, this path begins in the first section 15 with an input operation 30. The substrate is subsequently transferred to the first exposure position 11, where a measuring operation 31 for exact positioning and, subsequently, an exposure operation 32 are carried out. The substrate is transferred thereafter in a transfer operation 33 to the transfer position 40 in the intermediate storage device 45. From there, it is brought into the second exposure position, where a measuring operation 34 for measurement-aided positioning and, therefore, an exposure operation 35 are carried out. Finally, the substrate is removed from the projection exposure installation in an output step 36.

When a number of substrates are present simultaneously in the projection exposure installation, the above-described process cycle can proceed simultaneously at a number of substrates in a fashion offset in time. Of course, this requires a certain time offset in relation to the abovedescribed process cycle 30, 31, 32, 33, 34, 35. A number of such process cycles running in parallel are illustrated in FIG. 4. An optimized process cycle can be achieved, for example, by intermediately storing a wafer during the transfer from one wafer stage to the next, while the preceding wafer is calibrated by the preceding projection system for determining position, and the subsequent wafer is exposed beneath the downstream projection system. The phases of calibration and exposure of the wafer are thereby decoupled so that the laser light source 2 is optimally loaded.

A high level of utilization of the projection exposure installation, and thus a high wafer throughput can be achieved owing to the running in parallel. The time required for each process step is selected identically in FIG. 4 in order to simplify the illustration, but it goes without saying that different process steps require a different time duration in the normal case. The result is the creation of a method for successive exposure of wafers by at least two specialized projection systems 17, 18 in a projection platform 1.

The above description of the preferred embodiments has been given by way of example. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of the application. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. A microlithography projection exposure installation, comprising:
a first microlithography projection system, comprising:
a first illumination system configured to illuminate a first pattern; and
a first projection objective configured to image the first pattern onto a first substrate;
a second microlithography projection system, spatially separated from the first projection system, the second microlithography system comprising:
a second illumination system configured to illuminate a second pattern; and
a second projection objective configured to image the second pattern onto a second substrate;
a single light source assigned to both the first and second microlithography projection systems; and
an adjustable optical deflector in a light path downstream of the single light source, wherein:
the adjustable optical deflector is capable of deflecting light from the single light source along a first partial path to the first projection system or along a second partial path to the second projection system, and
the first and second microlithography projection systems each comprise a positioning device configured to position the substrate with the aid of measurement such that the position of the second substrate relative to a position of the first substrate is configured to be set with a positional error that is not greater than a smallest structural size to be projected onto the substrate.

2. The microlithography projection exposure installation of claim 1, wherein the adjustable optical deflector comprises a mirror that is rotatable and/or displaceable, or wherein the adjustable optical deflector comprises a reflecting prism that is rotatable and/or displaceable.

3. The microlithography projection exposure installation of claim 1, further comprising an optical arrangement in a light path downstream of the single light source, wherein the optical arrangement is configured to guide a first portion of light from the single light source into a first partial path to the first projection system, and the optical arrangement is configured to simultaneously guide a second portion of light from the single light source into a second partial path to the second projection system.

4. The microlithography projection exposure installation of claim 3, wherein the optical arrangement comprises a beam splitter.

5. The microlithography projection exposure installation of claim 1, wherein the single light source is configured to provide light having a wavelength that is shorter than 260 nm.

6. The microlithography projection exposure installation of claim 1, wherein the second substrate is identical to the first substrate.

7. The microlithography projection exposure installation of claim 1, wherein the second pattern is different from the first pattern.

8. The microlithography projection exposure installation of claim 1, wherein the first pattern is on an amplitude mask, and the second pattern is on a phase mask.

9. A method for multiply exposing a substrate coated with a photosensitive layer, the method comprising:
using a light source and a first microlithography projection system to perform a first exposure of the substrate in accordance with a first set of first exposure parameters; and
using the light source and a second microlithography projection system to perform a second exposure of the substrate in accordance with a second set of second exposure parameters, the second microlithography projection system being spatially separated from the first projection system,
wherein:
the method further comprises setting a position of the substrate in the second projection system relative to a position of the substrate in the first projection system with a positional error which is not greater than a smallest structural size to be projected onto the substrate;
each of the first and second microlithography projection systems comprises an illumination system which provides illumination radiation;
a value of at least one exposure parameter in the first microlithography projection system is different from a value of the at least one parameter in the second microlithography projection; and
the at least one parameter is selected from the group consisting of a degree of coherence σ of the illumination radiation, an annularity of the illumination radiation, a polarity of the illumination radiation, and an orientation of the illumination radiation with reference to at least one structural direction of a mask.

10. The method of claim 9, further comprising deflecting light from the light source along a first partial path to the first microlithography projection system to perform the first exposure, and/or deflecting light from the light source along a second partial path to the second microlithography projection system to perform the second exposure.

11. The method of claim 9, wherein the first exposure is performed using a first mask, the second exposure is performed using a second mask, and the second mask is different from the first mask.

12. The method of claim 11, wherein the first mask is an amplitude mask, and the second mask is a phase mask.

13. An installation, comprising:
a first illumination system configured to illuminate a first pattern arranged in a first light path passing through the first illumination system;
a second illumination system, spatially separated from the first illumination system, configured to illuminate a second pattern spatially separated from the first pattern and arranged in a second light path passing through the second illumination system; and
an optical element that is in the first and second light paths so that the optical element influences radiation in both the first and second light paths,
wherein the installation is a microlithography projection exposure installation,
wherein the first illumination system is configured to provide first illumination radiation according to a first set of exposure parameters, the second illumination system is configured to provide second illumination radiation according to a second set of exposure parameters, and wherein at least one exposure parameter differs between the first set of exposure parameters and the second set of exposure parameters, and
wherein the exposure parameter at least one exposure parameter that differs is selected from the group consisting of a degree of coherence a of the illumination radiation, an annularity of the illumination radiation, a polarity of the illumination radiation, and an orientation of the illumination radiation with reference to at least one structural direction of a mask.

14. The installation of claim 13, wherein the optical element comprises a reflective optical element.

15. The installation of claim 13, wherein the optical element comprises a reflecting prism.

16. The installation of claim 13, wherein the optical element is upstream of the first and second illumination systems between a light source of the installation and each of the first and second illumination systems.

17. The installation of claim 13, further comprising a projection objective configured to image at least one of the first and second patterns onto the substrate, wherein the installation is configured to multiply expose the substrate with both an image of the first pattern and an image of the second pattern.

18. The installation of claim 13, further comprising:
at least one first optical element in the first light path downstream of the first pattern between the first pattern and the substrate; and
at least one second optical element, spatially separated from the first optical element, in the second light path downstream of the second pattern between the second pattern and the substrate.

19. The installation of claim 13, further comprising:
a projection objective configured to image at least one of the first and second patterns onto the substrate;
a light source; and
a reflecting prism between the light source and the projection objective.

20. The installation of claim 13, further comprising:
a projection objective configured to image at least one of the first and second patterns onto the substrate;
a light source; and
a beam splitter arranged between the light source and the projection objective.

21. The installation of claim 13, wherein the second pattern differs from the first pattern.

22. The installation of claim 13, further comprising:
a first projection objective arranged in the first light path downstream of the first pattern; and
a second projection objective, spatially separated from the first projection objective, arranged in the second light path downstream of the second pattern.

23. The installation of claim 13, further comprising a single light source that is assigned to both the first illumination system and to the second illumination system.

24. A method for multiply exposing a substrate coated with a photosensitive layer, the method comprising:
using a light source and a first microlithography projection system to perform a first exposure of the substrate in accordance with a first set of first exposure parameters; and
using the light source and a second microlithography projection system to perform a second exposure of the substrate in accordance with a second set of second exposure parameters, the second microlithography projection system being spatially separated from the first projection system,
wherein:
each of the first and second microlithography projection systems comprises an illumination system which provides illumination radiation;
a value of at least one exposure parameter in the first microlithography projection system is different from a value of the at least one parameter in the second microlithography projection; and
the at least one parameter is selected from the group consisting of a degree of coherence a of the illumination radiation, an annularity of the illumination radiation, a polarity of the illumination radiation, and an orientation of the illumination radiation with reference to at least one structural direction of a mask.

* * * * *

UNITED STATES PATENT AND TRADEMARK OFFICE
CERTIFICATE OF CORRECTION

PATENT NO. : 8,634,060 B2  Page 1 of 1
APPLICATION NO. : 12/725223
DATED : January 21, 2014
INVENTOR(S) : Ralf Scharnweber It is certified that error appears in the above-identified patent and that said Letters Patent is hereby corrected as shown below:

In the Claims

Col. 13, line 1, in Claim 13, delete "coherence a" and insert -- coherence $\sigma$ --.

Col. 14, line 34 (approx.), in Claim 24, delete "coherence a" and insert -- coherence $\sigma$ --.

Signed and Sealed this
Twenty-ninth Day of April, 2014

Michelle K. Lee
*Deputy Director of the United States Patent and Trademark Office*